(12) United States Patent
Zhong et al.

(10) Patent No.: US 11,587,909 B2
(45) Date of Patent: *Feb. 21, 2023

(54) HIGH BANDWIDTH DIE TO DIE INTERCONNECT WITH PACKAGE AREA REDUCTION

(71) Applicant: Apple Inc., Cupertino, CA (US)

(72) Inventors: Chonghua Zhong, Cupertino, CA (US); Jun Zhai, Cupertino, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 161 days.

This patent is subject to a terminal disclaimer.

(21) Appl. No.: 16/991,908

(22) Filed: Aug. 12, 2020

(65) Prior Publication Data

US 2021/0020610 A1 Jan. 21, 2021

Related U.S. Application Data

(63) Continuation of application No. 16/287,635, filed on Feb. 27, 2019, now Pat. No. 10,770,433.

(51) Int. Cl.
*H01L 25/065* (2006.01)
*H01L 23/24* (2006.01)
(Continued)

(52) U.S. Cl.
CPC .......... *H01L 25/0657* (2013.01); *H01L 23/24* (2013.01); *H01L 23/5385* (2013.01);
(Continued)

(58) Field of Classification Search
CPC ..... H01L 25/0657; H01L 25/50; H01L 23/24; H01L 25/18; H01L 24/32; H01L 24/08; H01L 24/24; H01L 23/5385; H01L 23/5389; H01L 24/73; H01L 24/16; H01L 2224/32145; H01L 2224/16225;
(Continued)

(56) References Cited

U.S. PATENT DOCUMENTS 6,753,205 B2 6/2004 Halahan
8,957,525 B2 2/2015 Lyne et al.
(Continued)

FOREIGN PATENT DOCUMENTS

EP 3288076 A1 * 2/2018 ........... H01L 23/147
EP 3288076 A1 2/2018
(Continued)

OTHER PUBLICATIONS

Lu, Jian-Qiang et al. "Hybrid Metal/Polymer Wafer Bonding Platform", in Ramm Handbook of Wafer Bonding, Sep. 20, 2011, chapter 11, sections 1-5, pp. 215-236.
(Continued)

*Primary Examiner* — Herve-Louis Y Assouman
(74) *Attorney, Agent, or Firm* — Aikin & Gallant, LLP

(57) ABSTRACT

Package structure with folded die arrangements and methods of fabrication are described. In an embodiment, a package structure includes a first die and vertical interposer side-by-side. A second die is face down on an electrically connected with the vertical interposer, and a local interposer electrically connects the first die with the vertical interposer.

18 Claims, 7 Drawing Sheets

(51) Int. Cl.
*H01L 23/538* (2006.01)
*H01L 23/00* (2006.01)
*H01L 25/18* (2006.01)
*H01L 25/00* (2006.01)

(52) U.S. Cl.
CPC .......... *H01L 23/5389* (2013.01); *H01L 24/08* (2013.01); *H01L 24/16* (2013.01); *H01L 24/24* (2013.01); *H01L 24/32* (2013.01); *H01L 24/73* (2013.01); *H01L 25/18* (2013.01); *H01L 25/50* (2013.01); *H01L 2224/08225* (2013.01); *H01L 2224/16225* (2013.01); *H01L 2224/24155* (2013.01); *H01L 2224/24226* (2013.01); *H01L 2224/32145* (2013.01); *H01L 2224/32225* (2013.01); *H01L 2224/73267* (2013.01); *H01L 2225/06527* (2013.01); *H01L 2225/06548* (2013.01); *H01L 2225/06562* (2013.01); *H01L 2225/06586* (2013.01)

(58) Field of Classification Search
CPC . H01L 2225/06527; H01L 2224/73267; H01L 2224/08225; H01L 2224/24226; H01L 2225/06586; H01L 2225/06548; H01L 2224/32225; H01L 2225/06562; H01L 2224/24155
See application file for complete search history.

(56) References Cited

U.S. PATENT DOCUMENTS

| | | | |
|---|---|---|---|
| 9,396,300 B2 | 7/2016 | Wang et al. | |
| 9,559,081 B1 | 1/2017 | Lai et al. | |
| 9,583,472 B2 | 2/2017 | Chung et al. | |
| 9,780,072 B2 | 10/2017 | Jeng et al. | |
| 10,770,433 B1* | 9/2020 | Zhong | H01L 24/19 |
| 2008/0126716 A1 | 5/2008 | Daniels | |
| 2010/0078635 A1 | 4/2010 | Kuroda et al. | |
| 2011/0233676 A1* | 9/2011 | Or-Bach | H01L 21/84 |
| | | | 257/347 |
| 2012/0074586 A1 | 3/2012 | Seo et al. | |
| 2014/0159247 A1 | 6/2014 | Lyne et al. | |
| 2014/0210106 A1 | 7/2014 | Zhai | |
| 2014/0264836 A1 | 9/2014 | Chun et al. | |
| 2015/0113195 A1 | 4/2015 | Kim | |
| 2016/0079220 A1* | 3/2016 | Lin | H01L 25/0655 |
| | | | 257/737 |
| 2016/0099231 A1* | 4/2016 | Yang | H01L 23/5389 |
| | | | 257/774 |
| 2017/0062383 A1 | 3/2017 | Yee et al. | |
| 2017/0084589 A1* | 3/2017 | Kuo | H01L 23/3128 |
| 2017/0263518 A1* | 9/2017 | Yu | H01L 23/5389 |
| 2018/0061741 A1* | 3/2018 | Beyne | H01L 23/481 |
| 2018/0068978 A1 | 3/2018 | Jeng et al. | |
| 2018/0358298 A1 | 12/2018 | Zhai et al. | |
| 2019/0229046 A1* | 7/2019 | Tsai | H01L 24/81 |

FOREIGN PATENT DOCUMENTS

| | | |
|---|---|---|
| TW | 201642360 A | 12/2016 |
| TW | I585906 B | 6/2017 |
| TW | 201903979 A | 1/2019 |

OTHER PUBLICATIONS

ROC (Taiwan) Patent Appln. No. 109102479 Search Report dated Jun. 30, 2020, 1 page.
International Patent Appln. No. PCT/US2020/018883 "International Search Report and Written Opinion" dated Jun. 18, 2020, 13 pages.

* cited by examiner

HIGH BANDWIDTH DIE TO DIE INTERCONNECT WITH PACKAGE AREA REDUCTION

CROSS-REFERENCE TO RELATED APPLICATIONS

This application claims the benefit of priority and is a continuation of co-pending U.S. patent application Ser. No. 16/287,635, filed on Feb. 27, 2019, which is incorporated herein by reference.

BACKGROUND

Field

Embodiments described herein relate to semiconductor packaging, and more particularly to folded die package structures.

Background Information

The current market demand for portable and mobile electronic devices such as mobile phones, personal digital assistants (PDAs), digital cameras, portable players, gaming, and other mobile devices requires the integration of more performance and features into increasingly smaller spaces. While the form factor (e.g. thickness) and footprint (e.g. area) for semiconductor die packaging is decreasing, system on chip (SoC) designs are becoming more complex.

Scaling of features to lower technology nodes in a monolithic die has typically been the way forward for both accommodating higher SoC demands and area reduction. This in turn has placed significantly higher demands on design verification, which has led to partitioning of the hardware and/or software of certain SoC cores (also referred to as IP blocks) within the chip (also referred to as die) such as the central processing unit (CPU), GPU (graphics processing unit), memory-application processor (MEM/AP), voltage regulation, passives integration, etc.

More recently, industry has begun to look at die splitting of SoC cores into separate dies. Several advanced packaging solutions have emerged as potential candidates to accommodate SoC die splitting such as fan-out packaging with a redistribution layer (RDL), 2.5D packaging with dies mounted side-by-side on an interposer, or 3D packaging with stacked dies.

SUMMARY

Embodiments describe package structures that include a folded die arrangement. In particular, such folded die arrangements may be used to split SoC cores into separate dies. In an embodiment, the folded die arrangement is accomplished with the combination of a vertical interposer and local interposer to electrically connect the split dies. The vertical interposer provides vertical interconnection, while the local interposer provides lateral interconnection.

DETAILED DESCRIPTION

Figure 1:
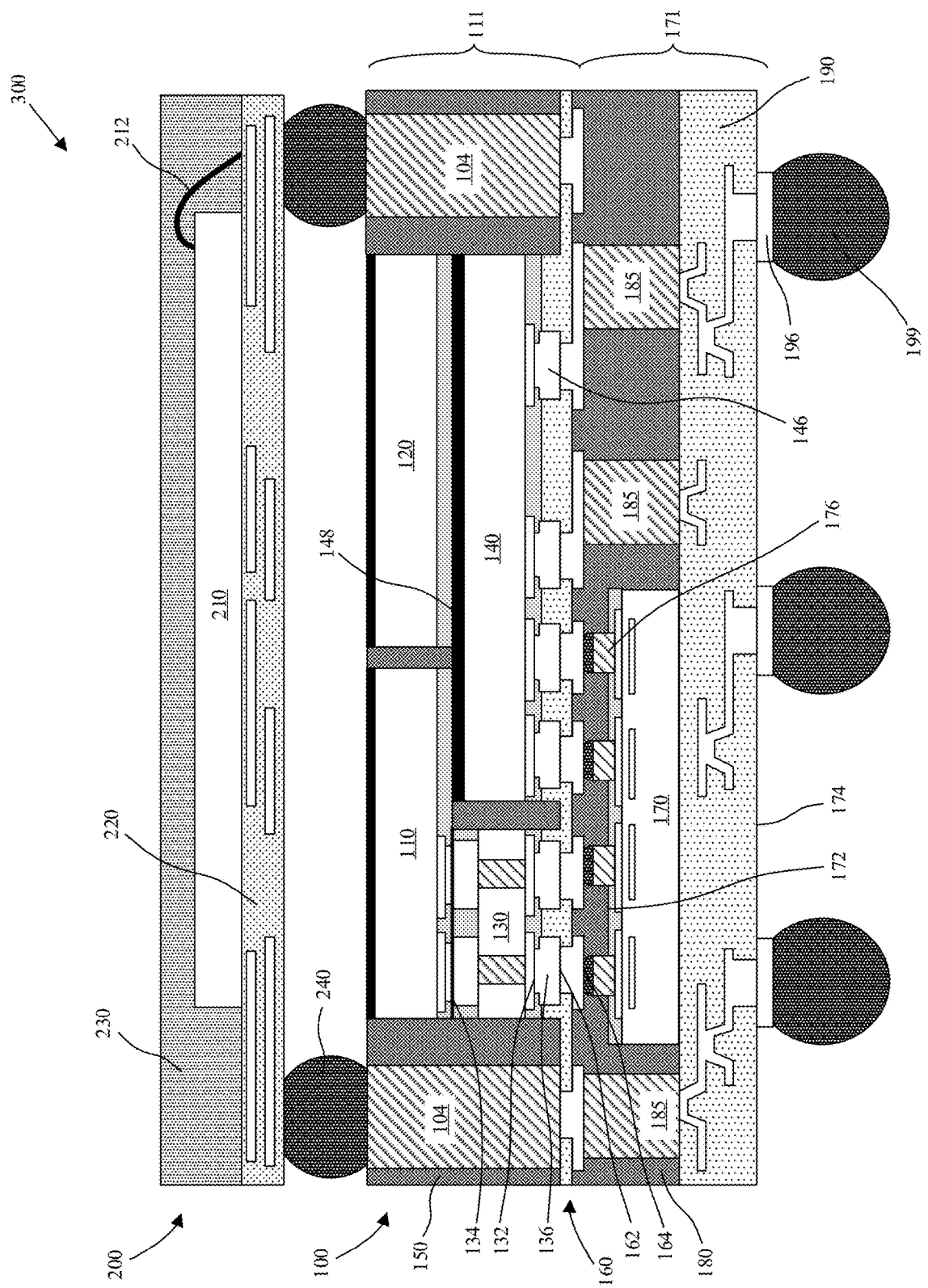
FIG. 1 is a cross-sectional side view illustration of a package on package structure in accordance with an embodiment.

Embodiments describe package structures that include a folded die arrangement. In particular, such folded die arrangements may be used to split SoC cores into separate dies. In an embodiment, a package structure includes a first wiring layer including a first side and a second side opposite the first side. A first die and a vertical interposer may be located side-by-side on the first side of the first wiring layer. The vertical interposer includes electrical interconnects from a first side of the vertical interposer coupled with the first side of the first wiring layer to a second side of the vertical interposer opposite the first side of the vertical interposer. A second die is located face down on and electrically connected with the second side of the vertical interposer, and a local interposer is located on the second side of the first wiring layer and in electrical connection with the first die and the vertical interposer.

In one aspect, the folded die package structures in accordance with embodiments can leverage both vertical stacking and a local interposer to simultaneously achieve both high bandwidth die-to-die interconnects and package footprint (area) reduction. Such a stacked arrangement may reduce footprint compared to a fan-out RDL or 2.5D packaging solution. Furthermore, such a stacked arrangement may provide significant cost savings compared to a 3D packaging solution in which face-to-face die interconnections formed using techniques such as through-silicon vias (TSVs) can be expensive.

In various embodiments description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "span" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between"

layers may be directly in contact with the layers or may have one or more intervening layers.

Referring now to FIG. 1 a cross-sectional side view illustration is provided of a package on package (PoP) structure in accordance with embodiments. As shown, the PoP structure 300 may include a lower package structure 100 with a folded die arrangement in accordance with embodiments, and a top package structure 200 mounted on the lower package structure 100. As shown, the lower package structure 100 may include a first package level 111 and second package level 171 beneath the first package level 111. The first package level may include a first die 140 that is stacked on, and offset with, a first die 110. For example, this may be accomplished by stacking the first die 140 on the second die 110 and a mechanical chiplet 120 (e.g. silicon). A vertical interposer 130 is also stacked on the second die 110, and electrically connected with the second die. A wiring layer 160 spans across terminals 146 of the first die 140 and terminals 136 of the vertical interposer 130. In accordance with embodiments, the wiring layer 160 may fan out, or fan in, connections with the vertical interposer 130 and first die 140. While the wiring layer 160 may form some electrical connections between the vertical interposer 130 and first die 140, in accordance with embodiments the wiring layer 160 does not form all electrical connections between the vertical interposer 130 and the first die 140. In some embodiments, the wiring layer 160 does not include any electrical connections between the vertical interposer and the first die. As shown in FIG. 1, a local interposer 170 located within the second package level 171 may be used to complete electrical connections between the first die 140 and vertical interposer 130, which in turn connects to the second die 110 completing an electrical path from the first die 140, to wiring layer 160 (optional), to local interposer 170, to wiring layer 160 (optional), to vertical interposer 130, to second die 110. Accordingly, this approach leveraged both vertical stacking of (first die 140, second die 110, vertical interposer 130) as well as local interposer 170 to achieve both high bandwidth die-to-die interconnects and package area reduction.

In accordance with embodiments, the first die 140 may be a main chip including higher performance cores (e.g. CPU, GPU) or cores fabricated with smaller node technology, while the second die 110 may be a daughter chip including lower performance cores (e.g. RF, memory) or cores fabricated with a larger node technology, for example. A variety of potential reasons are contemplated for die splitting.

In an embodiment, a package structure includes a first wiring layer 160 including a first side 162 and a second side 164 opposite the first side. A first die 140 and a vertical interposer 130 are located side-by-side (and laterally adjacent) on the first side 162 of the first wiring layer 160. The vertical interposer 130 include electrical interconnects 130 from a first side 132 of the vertical interposer coupled with the first side 162 of the first wiring layer 160 to a second side 164 of the vertical interposer opposite the first side of the vertical interposer. The electrical interconnects 130 may be, or include, pillars or through silicon vias (TSVs) through a bulk silicon chiplet for example. A second die 110 is face down on and electrically connected with the second side 134 of the vertical interposer 130. In accordance with embodiments, a local interposer 170 is mounted on the second side 164 of the first wiring layer 160 and in electrical connection with the first die 140 and the vertical interposer 130. In an embodiment, the local interposer 170 includes a plurality of terminals 176 on a first side 172 of the local interposer that is coupled with the second side 164 of the first wiring layer 160, and the local interposer 170 does not include a terminal on a second side 174 of the local interposer opposite the first side 172 of the local interposer. Thus, the local interposer 170 may function for lateral routing between the first die 140 and vertical interposer 130 as opposed to vertical routing of the vertical interposer 130.

Still referring to FIG. 1, a first molding compound 150 may encapsulate the first die 140, the vertical interposer 130, and the second die 110. Additionally, a mechanical chiplet 120 may be attached to the first die 140 laterally adjacent to the second die 110. More specifically, the first die 140 may be attached to the second die 110 and mechanical chiplet 120, for example, with an adhesive layer 148. A first plurality of conductive pillars 104 can extend from the first wiring layer 160 and through the first molding compound 150.

A second molding compound 180 may encapsulate the local interposer 170 on the second side 164 of the first wiring layer 160. Additionally, a second plurality of conductive pillars 185 can extend from the first wiring layer 160 and through the second molding compound 180. As illustrated, a second wiring layer 190 may be formed on the second molding compound 180 and connected to the second plurality of conductive pillars 185. In an embodiment, the second wiring layer 190 is on a planarized surface including the second molding compound 180, the second plurality of conductive pillars 185, and the local interposer 170. Solder bumps 199 may be placed on landing pads 196 of the second wiring layer 190. For example, solder bumps 199 may be used for mounting onto a circuit board.

In the particular package-on-package (PoP) embodiment illustrated in FIG. 1, a second package 200 can be mounted on the lower package 100. For example, the second package 200 can be mounted on an in electrical connection with the first plurality of conductive pillars 104. In an embodiment, the second package includes a chip 210 connected with a wiring substrate 220, and encapsulated within a molding compound 230. In an embodiment the chip 210 is a memory chip, such as dynamic random-access memory (DRAM) or NAND. Chip 210 may be connected with the wiring substrate 220 by a variety of methods, including wire bonds 212.

Figure 2:
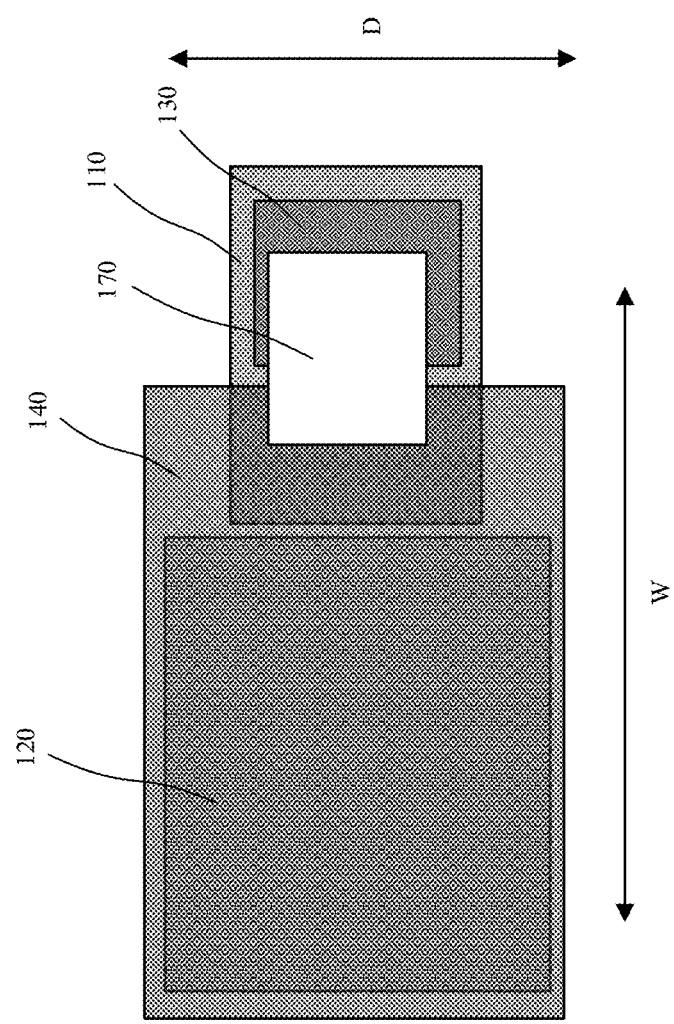
FIG. 2 is a schematic top view layout illustration of various package components in accordance with an embodiment.

FIG. 2 is a schematic top view layout illustration of various package components in accordance with an embodiment. While embodiments are not limited to the particular configuration provided, FIG. 2 is to be understood as a particularly graceful implementation of a folded die structure in accordance with embodiments. As shown, the first die 140 may occupy the largest area within the package structure. The first die 140 is also located beneath the second die 110. This location may facilitate closest routing to a circuit board within the package structure.

As shown, the first die 140 and vertical interposer 130 are laterally adjacent to one another, or side-by-side. The second die 110, or daughter chip, may be sized as necessary depending on the cores it contains. The relative widths (W) of the components are illustrated in the direction of lateral overlap illustrated in FIG. 1. The relative depths (D) of the components are illustrated in a direction orthogonal to widths. In an embodiment, the second die 110 overlaps the vertical interposer 130, and may completely overlap the area of the vertical interposer 130. The second die 110 may partially or completely overlap the first die 140. In the embodiment illustrated, the second die 110 has a smaller area than the first die 140 and only partially overlaps the first die 140. In such an embodiment, a mechanical chiplet 120 may overlap some remaining area of the first die 140. This may provide mechanical stability and thermal expansion matching for the package structure. The mechanical chiplet 120 may additionally help thermal performance. As shown, the local interposer 170 overlaps the first die 140 and the vertical interposer 130. As illustrated, comparative depths (D) of the components may only be as deep as necessary for lateral and vertical routing. For example, local interposer depth (D) may be less than with the first chip 140 and optionally the vertical interposer 130. The vertical interposer 130 may have a smaller depth than the second die 110, and optionally the local interposer 170.

In an embodiment, the first die 140 occupies a larger area than the second die 110. The first die 140 and the second die 110 may include split logic. For example, one IP logic block (e.g. CPU) may be in one die, with another IP logic block (GPU) in another die. In another example, one IP logic block (e.g. higher performance block, with optional smaller processing node) is in one die, with another IP logic block (e.g. lower performance block, with optional larger processing node) in the second die. In an embodiment, first transistors of the first die 140 are formed with a smaller processing node than second transistors of the second die 110.

Figure 3:
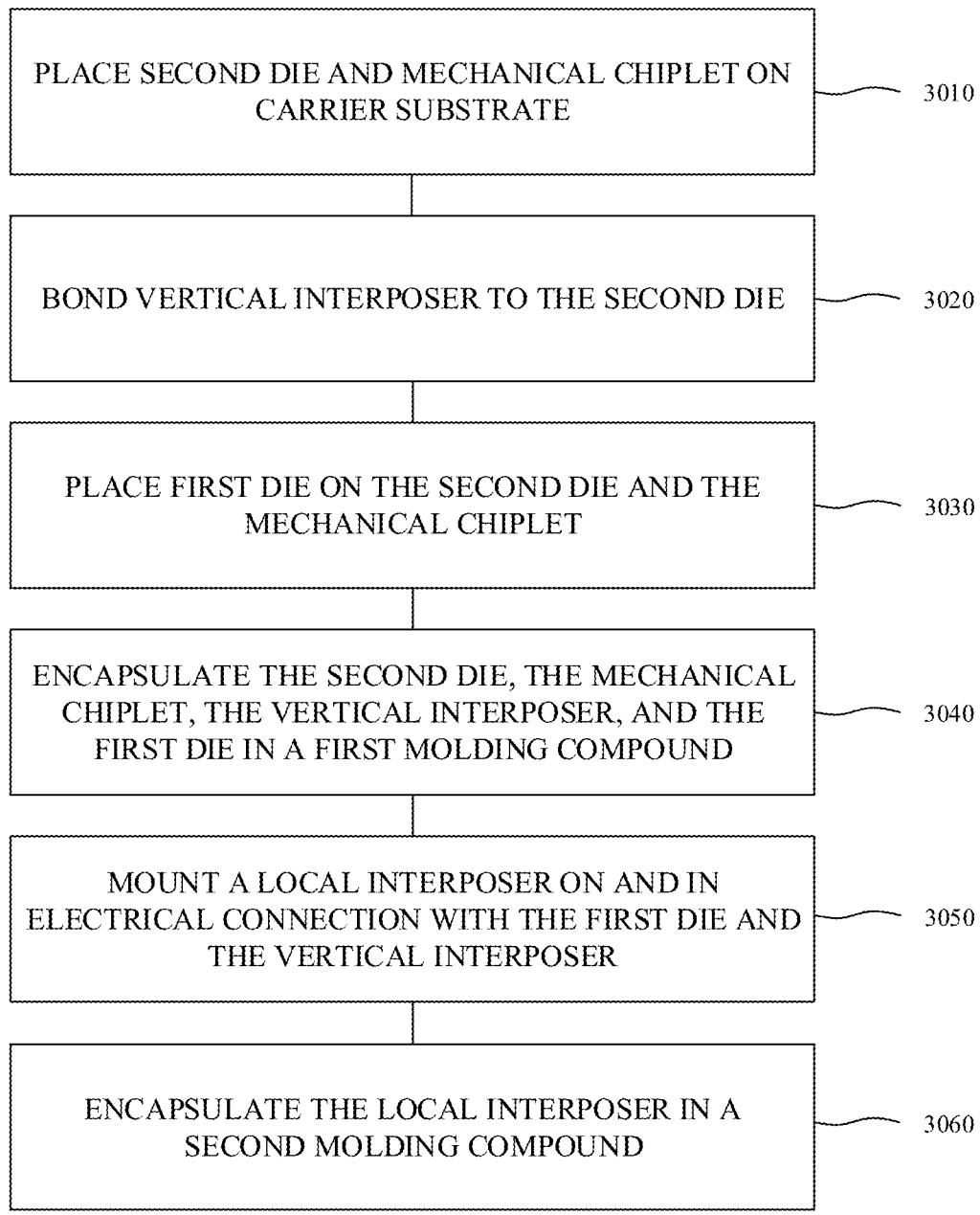
FIG. 3 is a flow chart illustrating a sequence of forming a package structure in accordance with an embodiment.

Referring now to FIG. 3 and FIGS. 4A-4F, FIG. 3 is a flow chart illustrating a sequence of forming a package structure in accordance with an embodiment; FIGS. 4A-4F are cross-sectional side view illustrations of a sequence of forming a package structure in accordance with an embodiment. In interest of clarity and conciseness, the flow chart of FIG. 3 is described with reference to the features illustrated in FIGS. 4A-4F. In the following description, the processing sequence may be used to form the package structure, and in particular, the first and second package level structures described with regard to FIG. 1, as well as the structural variations provided in FIG. 5 and FIG. 6.

Figure 4A:
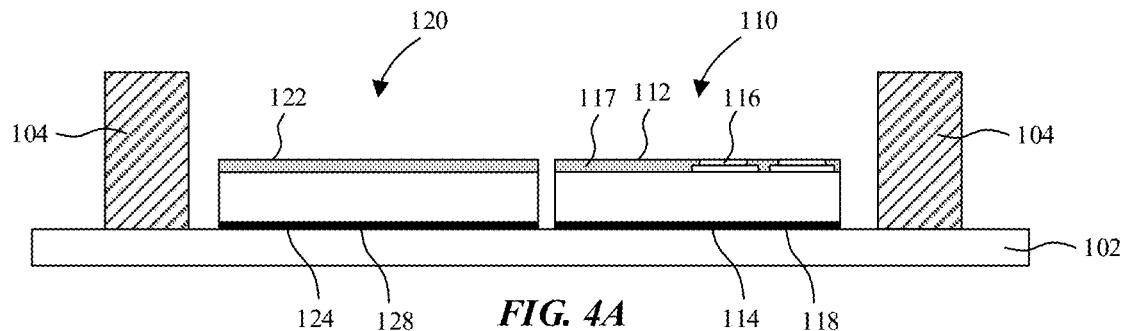
FIGS. 4A-4F are cross-sectional side view illustrations of a sequence of forming a package structure in accordance with an embodiment.

As shown in FIG. 4A, at operation 3010 a second die 110 and a mechanical chiplet 120 are placed onto a carrier substrate 102. The second die 110 may include a first side 112 and second side 114 opposite the first side. Likewise, the mechanical chiplet 120 may include a first side 122 opposite a second side 124. In the embodiment illustrated, the second die 110 is attached to the carrier substrate 102 face up. In an embodiment, the first side 112 of the second die 110 includes exposed terminals 116 (e.g. copper pads) and a passivation material 117. In some embodiments passivation material 117 may be an oxide material (e.g. silicon oxide) for hybrid-bonding. The second die 110 and mechanical chiplet 120 may optionally be secured on the carrier substrate 102 with adhesive layers 118, 128, respectively. In an embodiment, the mechanical chiplet 120 is formed of silicon for thermal expansion matching.

In the embodiment illustrated in FIG. 4A a first plurality of conductive pillars 104 are located on the carrier substrate 102. The first plurality of conductive pillars 104 may be formed prior to placement of the second die 110 and mechanical chiplet 120. For example, the first plurality of conductive pillars 104 may be plated. Alternatively, the first plurality of conductive pillars 104 can be placed on the substrate. This may occur prior to placement of the second die 110 and mechanical chiplet 120, or at a later time. In an embodiment, the second die 110 and mechanical chiplet 120 are placed within a periphery, or between rows of the first plurality of conductive pillars 104.

Figure 4B:
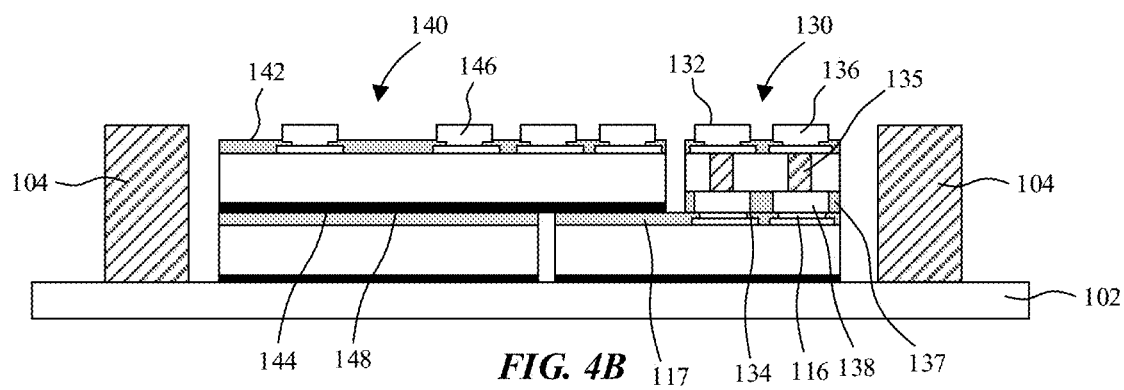

At operation 3020 a vertical interposer 130 is bonded to the second die 110 as illustrated in FIG. 4B. The vertical interposer 130 may be bonded using a technique such as hybrid bonding to achieve a high density terminal pitch (e.g. less than 15 μm), or use of micro (solder) bumps to achieve a terminal pitch density of less than 40 μm. The vertical interposer 130 may include terminals 136 on a first side 132 of the vertical interposer, electrical interconnects 135 that extend from the terminals 136 to terminals 138 on a second side 134 of the vertical interposer opposite the first side of the vertical interposer. Terminals 138 are bonded to the terminals 116 of the second die 110. In the particular embodiment illustrated, terminals 138 and passivation layer 137 (e.g. oxide) on the second side 134 of the vertical interposer 130 are hybrid bonded (metal-metal and oxide-oxide) with the terminals 116 and passivation layer 117 of the second die 110.

Still referring to FIG. 4B, at operation 3030 a first die 140 is placed on the second die 110, and optionally, a mechanical chiplet 120. The first die 140 may be placed face up and secured with an adhesive 148. As illustrated, the first die 140 includes a first side 142 including terminals 146 and a second side 144 opposite the first side 142. The second die 110 and mechanical chiplet 120 may be approximately the same height to facilitate attaching the first die 140.

It is to be appreciated that variations may exist in the processing sequence. For example, the first die 140 may be placed prior to bonding the vertical interposer 130. In another variation, the vertical interposer 130 and second die 110 are bonded prior to placement on the carrier substrate 102. Furthermore, the first plurality of conductive pillars 104 may be formed, or placed at various times.

Figure 4C:
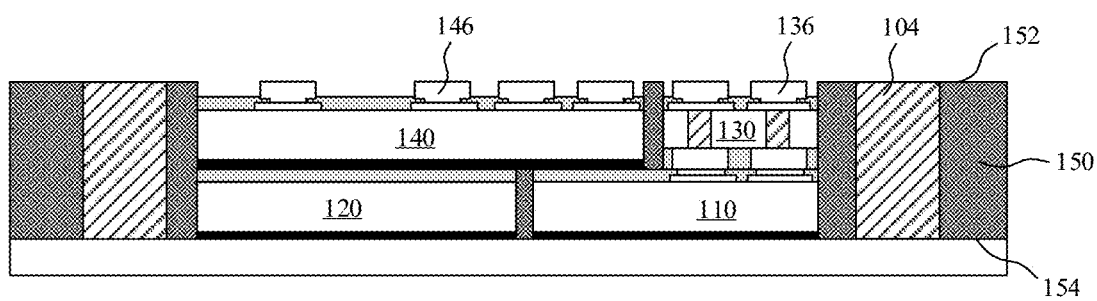

Referring now to FIG. 4C, at operation 3040 the second die 110, the optional mechanical chiplet 120, the vertical interposer 130, the first die 140, and optionally the first plurality of conductive pillars 104 are encapsulated in a molding compound 150. This may be followed by additional planarization and/or etching to expose terminals 146, 136 and the first plurality of conductive pillars 104, which may extend between a first side 152 and second side 154 of the molding compound 150. In an alternative processing sequence, the first plurality of conductive pillars 104 are formed in the molding compound 150 after the molding operation.

Figure 4D:
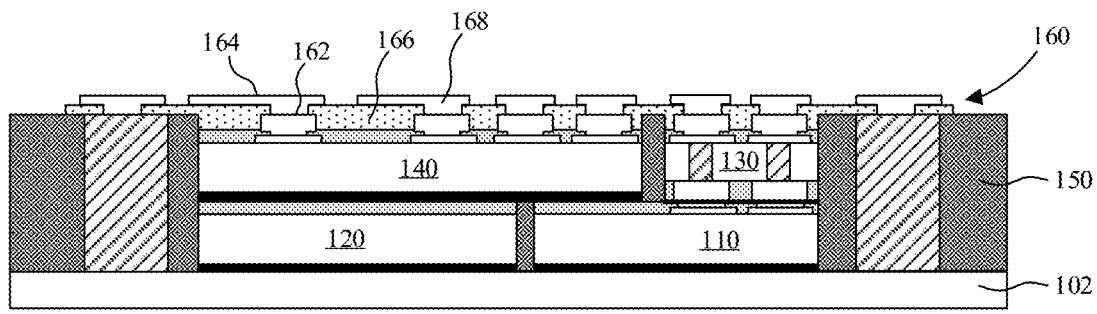

A wiring layer 160 is then optionally formed on the first side 152 of the molding compound, first side 142 of the first die 140, first side 132 of the vertical interposer 130 and in electrical connection with the terminals 146 of the first die 140 and terminals 136 of the vertical interposer 130 as illustrated in FIG. 4D. Wiring layer 160 may also be referred to as a redistribution layer (RDL). For example, wiring layer 160 may be formed with dielectric layer 166 deposition and patterning, and metal seed deposition, patterning and plating (e.g. copper) to form redistribution lines 168. Contact pads may also be formed as a part of or in addition to redistribution lines in the wiring layer 160.

Figure 4E:
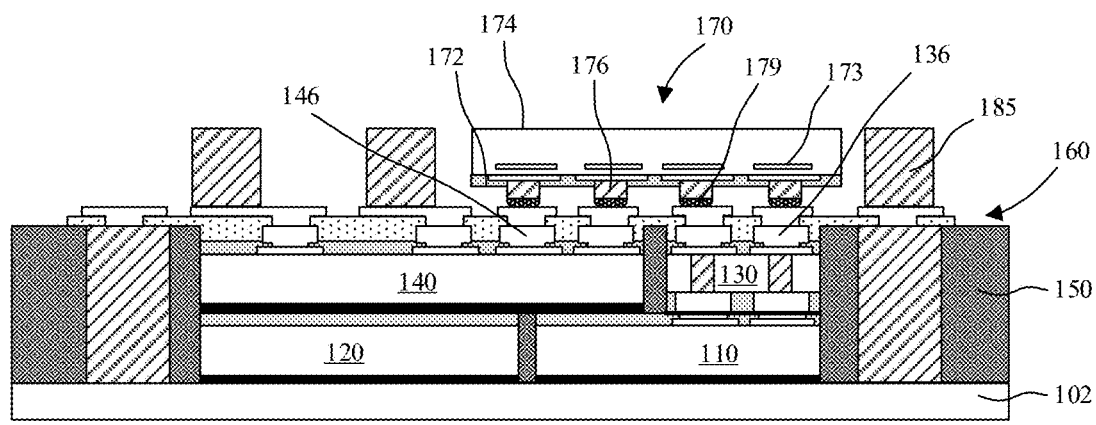

Referring now to FIG. 4E, at operation 3050 a local interposer 170 is mounted on an in electrical connection with the first die 140 and the vertical interposer 130. In an embodiment the local interposer 170 includes a single face and is mounted face down. For example, local interposer 170 includes a first side 172, a second side opposite the first side 174. The first side includes a plurality of terminals 176 bonded to terminals 146, 136 of the first die 140 and vertical interposer 130, respectively. In an embodiment, bonding is accomplished with solder bumps 179. As shown, the local interposer 170 includes routing 173 to electrically connect the vertical interposer 130 and first die 140.

Similarly, as with the first plurality of conductive pillars 104, a second plurality of conductive pillars 185 may be formed on the wiring layer 160. The second plurality of conductive pillars 185 may be formed prior to placement of the local interposer 170. For example, the second plurality of conductive pillars 185 may be plated. Alternatively, the second plurality of conductive pillars 185 can be placed on the underlying structure. This may occur prior to placement of the local interposer 170, or at a later time. In an embodiment, the local interposer 170 is placed within a periphery, or between rows of the second plurality of conductive pillars 185.

Figure 4F:
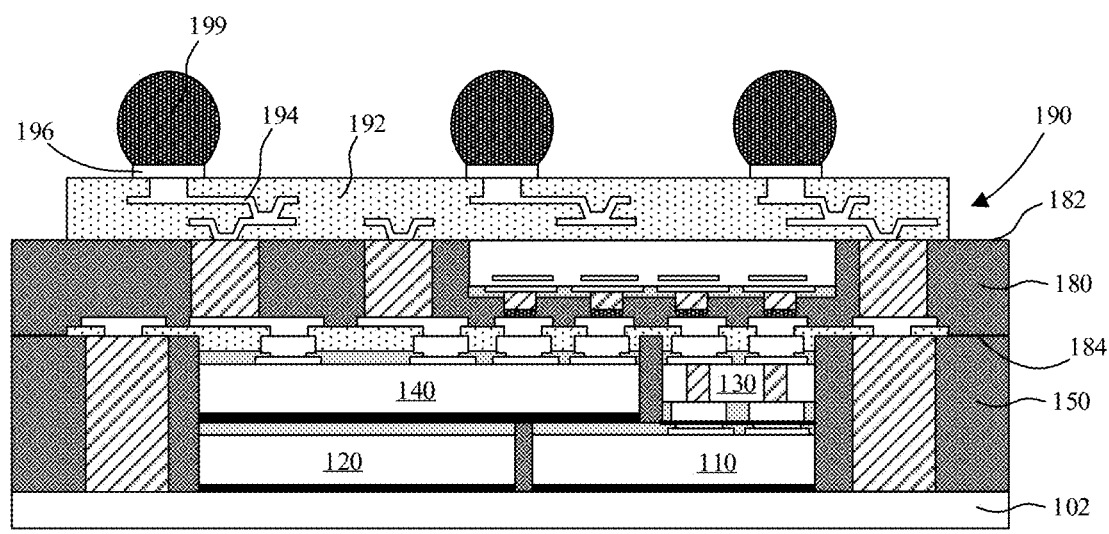

Referring now to FIG. 4F, at operation 3060 the local interposer 170 and optionally second plurality of conductive pillars 185 are encapsulated in a second molding compound 180. This may be followed by additional planarization and/or etching to expose a second side 174 of the local interposer 170 and the second plurality of conductive pillars 185, which may extend between a first side 182 and second side 184 of the second molding compound 180. In an alternative processing sequence, the second plurality of conductive pillars 185 are formed in the molding compound 180 after the molding operation.

Various processing sequences may then be performed depending upon the final package structure to be formed. In the exemplary embodiment illustrated in FIG. 4F a second wiring layer 190 including one or more insulation layers 192 and wiring layers 194 is formed on the first side 182 of the second molding compound 180, the exposed second plurality of pillars 185, and optionally directly on the second side 174 of the local interposer 170. The second wiring layer 190 may include landing pads 196, and solder bumps 199 may be placed on the landing pads 196 for further integration, followed by removal of the carrier substrate 102.

Figure 5:
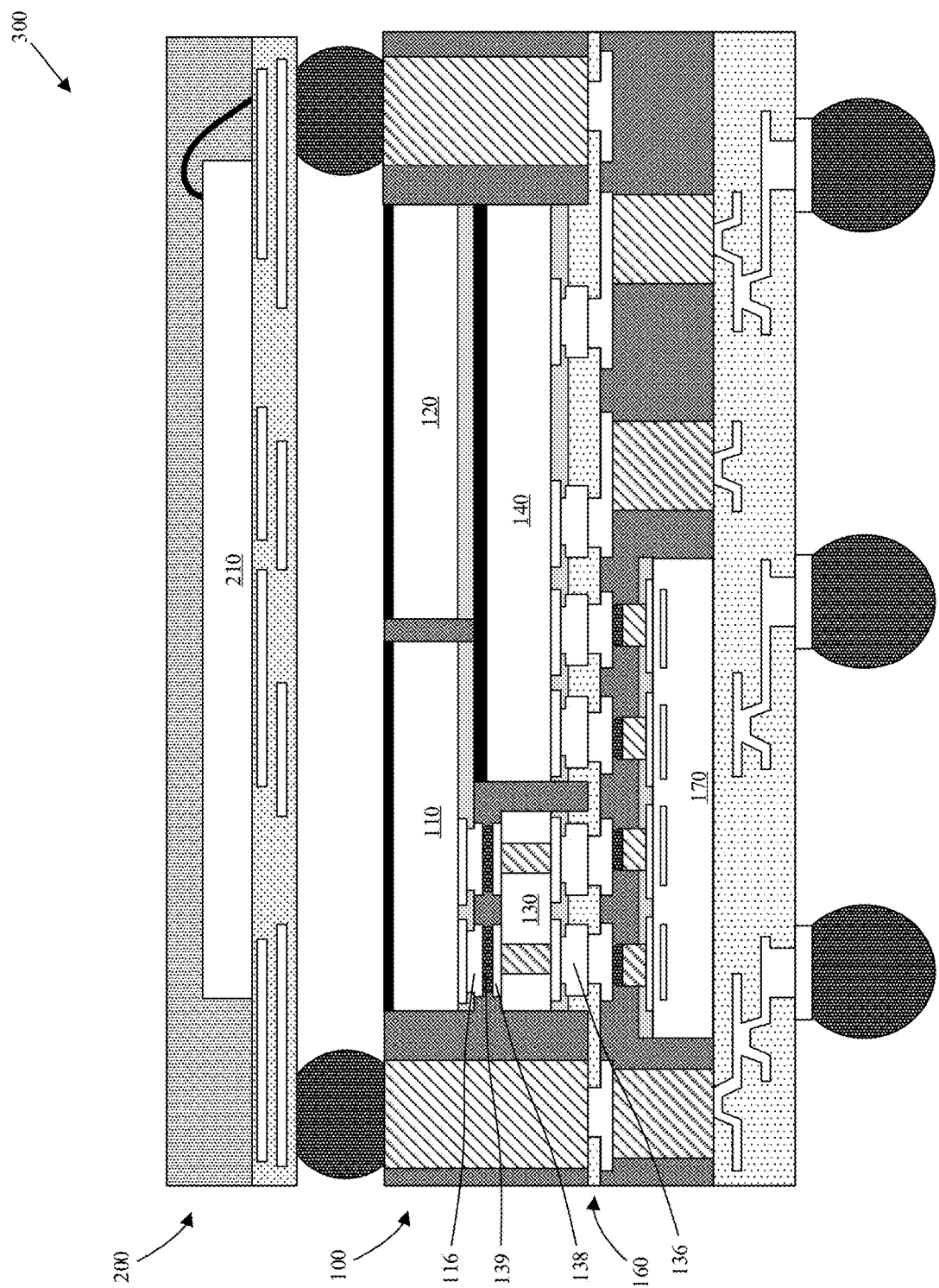
FIG. 5 is a cross-sectional side view illustration of a package on package structure in accordance with an embodiment.

FIG. 5 is a cross-sectional side view illustration of a package on package structure in accordance with an embodiment. FIG. 5 is substantially similar to the structure provided in FIG. 1, with except the vertical interposer 130 is bonded to the second die 110 using micro (solder) bumps 139.

Figure 6:
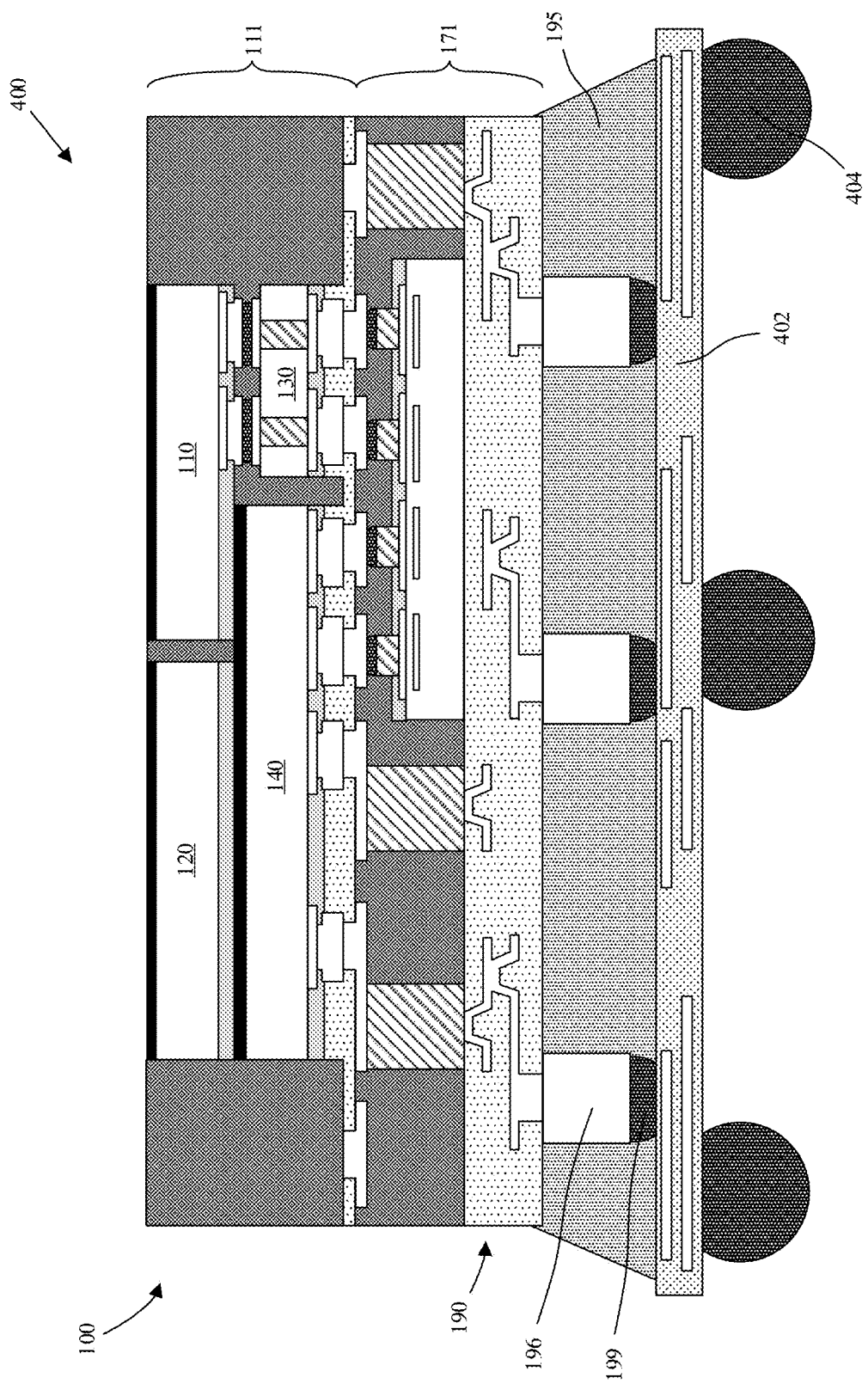
FIG. 6 is a cross-sectional side view illustration of a flip chip ball grid array package structure in accordance with an embodiment.

FIG. 6 is a cross-sectional side view illustration of a flip chip ball grid array (FCBGA) package structure in accordance with an embodiment. As previously described, the package structure including the first and second package levels 111, 171 may be integrated into a variety of package configurations including PoP and flip chip FCBGA. In an embodiment illustrated in FIG. 6, landing pads 196 may be on studs 197. The package structure 100 may be bonded to a package substrate 402 with solder bumps 199. An underfill material 195 may then be applied between the package 100 and the package substrate 402. Package (solder) bumps 404 may then be applied to the opposite side of the package substrate 402 for mounting onto a circuit board, etc.

In utilizing the various aspects of the embodiments, it would become apparent to one skilled in the art that combinations or variations of the above embodiments are possible for forming a folded die package structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package structure comprising:
    a first wiring layer including a first side and a second side opposite the first side;
    a first die and a vertical interposer side-by-side on the first side of the first wiring layer, wherein the vertical interposer includes electrical interconnects from a first side of the vertical interposer coupled with the first side of the first wiring layer to a second side of the vertical interposer opposite the first side of the vertical interposer;
    a second die face down on and electrically connected with the second side of the vertical interposer; and
    a local interposer on the second side of the first wiring layer and in electrical connection with the first die and the vertical interposer, wherein the local interposer is completely underneath a footprint of the second die;
    wherein the second die includes a first lateral die edge and a second lateral die edge opposite the first lateral die edge and a plurality of terminals that is offset toward the first lateral die edge, wherein the plurality of terminals is electrically connected with the vertical interposer and the second lateral die edge of the second die spans over the first die.

2. The package of claim 1, wherein the first die comprises a first core selected from the group consisting of a central processing unit and a graphics processing unit.

3. The package structure of claim 1, wherein the first die and the second die comprise split logic.

4. The package structure of claim 1, wherein the local interposer includes a plurality of terminals on a first side of the local interposer that is coupled with the second side of the first wiring layer, and the local interposer does not include a terminal on a second side of the local interposer opposite the first side of the local interposer.

5. The package structure of claim 1, further comprising a first molding compound encapsulating the first die, the vertical interposer, and the second die.

6. The package structure of claim 1, wherein the first die occupies a larger area than the second die.

7. The package structure of claim 1, further comprising a mechanical chiplet attached to the first die laterally adjacent to the second die.

8. The package structure of claim 1, wherein the local interposer overlaps the first die and the vertical interposer.

9. The package structure of claim 1, wherein the first die includes first transistors of a first size, and the second die includes second transistors of a second size different than the first size.

10. The package of claim 2, wherein the second die comprises a memory core.

11. The package of claim 2, wherein the second die comprises an RF core.

12. The package structure of claim 5, further comprising a second molding compound encapsulating the local interposer on the second side of the first wiring layer.

13. The package structure of claim 12, further comprising a first plurality of conductive pillars extending from the first wiring layer and through the first molding compound.

14. The package structure of claim 13, further comprising a second plurality of conductive pillars extending from the first wiring layer and through the second molding compound.

15. The package structure of claim 14, further comprising a second wiring layer on the second molding compound and connected to the second plurality of conductive pillars.

16. The package structure of claim 15, wherein the second wiring layer is on a planarized surface including the second molding compound, the second plurality of conductive pillars, and the local interposer.

17. The package structure of claim 6, wherein the second die occupies a larger area than both the vertical interposer and the local interposer.

18. The package structure of claim 8, wherein the second die completely overlaps the local interposer.

\* \* \* \* \*